United States Patent [19]
Fujimori et al.

[11] Patent Number: 6,014,075
[45] Date of Patent: Jan. 11, 2000

[54] INDICATING INSTRUMENT HAVING STEPPING MOTOR

[75] Inventors: Norio Fujimori, Tokai; Hideyuki Nakane, Nishio; Tatsuya Seto, Kariya, all of Japan

[73] Assignee: Nippondenso Co., Ltd., Kariya, Japan

[21] Appl. No.: 08/668,470

[22] Filed: Jun. 25, 1996

[30] Foreign Application Priority Data

Jul. 27, 1995 [JP] Japan ................................. 7-192086

[51] Int. Cl.[7] ............................................. B60Q 1/00
[52] U.S. Cl. ......................... 340/461; 73/1.88; 116/288; 116/291
[58] Field of Search ............................ 340/461, 688; 116/288, 290, 291, 292, 296, 297; 362/32, 27, 28; 318/696; 29/595, 593

[56] References Cited

U.S. PATENT DOCUMENTS

| | | | |
|---|---|---|---|
| 3,425,392 | 2/1969 | Bond | 116/297 |
| 4,646,007 | 2/1987 | Faria | 116/297 |
| 5,042,016 | 8/1991 | Suzuki et al. | 368/185 |
| 5,062,135 | 10/1991 | Ohike | 116/297 |
| 5,295,049 | 3/1994 | Terada | 362/27 |
| 5,333,371 | 8/1994 | Mittenbühler et al. | 29/595 |
| 5,665,897 | 9/1997 | Lippmann et al. | 73/1.01 |

FOREIGN PATENT DOCUMENTS

| | | |
|---|---|---|
| 021 968 | 1/1981 | European Pat. Off. . |
| 6-038593 | 2/1994 | Japan . |
| 6094858 | 4/1994 | Japan . |
| 7-225246 | 8/1995 | Japan . |
| 7-270193 | 10/1995 | Japan . |

*Primary Examiner*—Brent A. Swarthout
*Attorney, Agent, or Firm*—Pillsbury Madison & Sutro LLP

[57] ABSTRACT

A zero-position stopper to stop the pointer when it is returned to the zero position and a maximum-position stopper to stop the pointer when it is located at the maximum position are provided. A microcomputer generates a zero-start signal when an ignition switch is turned on so that pointer moves from the zero position and engages the maximum position stopper, and thereafter generates a zero-return signal so that the pointer returns to the zero-position stopper. When the pointer engages the zero-position stopper, the computer does not generate a control signal.

5 Claims, 5 Drawing Sheets

ND ICATING INSTRUMENT HAVING
STEPPING MOTOR

CROSS REFERENCE TO RELATED APPLICATION

The present application is based on and claims priority from Japanese Patent Application No. Hei 7-192086, filed on Jul. 27, 1995, the contents of which are incorporated herein by reference.

BACKGROUND OF THE INVENTION

1. Field of the Invention

The present invention relates to an indicating instrument having a stepping motor and, more particularly, relates to an indicating instrument such as a speedometer for a vehicle which has a stepping motor as a movement.

2. Description of the Related Art

Conventionally, a two-phase PM-type stepping motor, in which a magnet rotor is movably installed in a couple of stators, is adopted in an indicating instrument for a vehicle. In such an indicating instrument, sine (SIN) wave current and cosine (COS) wave current are respectively supplied to the stator coils at the same phase so as to rotate the magnet rotor according to a magnetic field composed of magnetic fields generated by the respective currents, thereby driving the indicator.

The indicator is kept staying at the zero position until the instrument is shipped.

However, if mechanical vibration or a shock is applied to the indicating instrument before it is shipped before being mounted on a vehicle, the magnet rotor may rotate to separate the indicator away from the zero position. In addition, even if such shock is applied to the indicator instrument after it is mounted on a vehicle, the indicator may be separated from the zero position.

In order to solve the above problem, JP-A-6-38593 proposes to provide a stopper near the zero position of a dial plate and engage the indicator with the stopper by supplying the sine wave and cosine wave currents to the respective stator coils to rotate the magnet rotor in the direction of the indicator returning to the zero position.

However, in the indicator instrument disclosed in the above publication, the sine and cosine wave currents keep flowing to maintain the magnetic field even after the indicator engages the stopper. As a result, the magnet rotor stands still with the indicator in engagement with the stopper, while the magnetic field generated by the stator rotates. Accordingly, the attracting force and the repulsion force are alternately generated between the stator and the rotor, and the indicator vibrates in a manner that it leaves or engages the stopper. Such vibration deteriorates the visibility of the indicating instrument and makes a noise.

SUMMARY OF THE INVENTION

The present invention is made in view of the above problem and has an object of providing an indicating instrument having a simple stepping motor which does not deteriorate the visibility when the indicator is returned to the zero position without making noise.

According to the present invention, the following stepping motor type indicating instrument is adopted. That is, an indicating instrument which comprises: a stepping motor; a pointer moving as the stepping motor rotates; a zero-position stopper for stopping the pointer when the pointer is returned to a zero dial position; a maximum-position stopper for stopping the pointer when the pointer is moved to a maximum-dial position; control signal generating means for generating a zero-start signal which corresponds to a control signal to rotate the pointer from the zero-dial position to the maximum-dial position and, thereafter, return the pointer from the maximum-dial position to the zero-dial position; and driving means for driving the stepping motor according to the zero-start signal and the zero-return signal.

The control signal generating means generates the zero-start signal corresponding to a control signal to rotate the pointer from the zero position to the maximum-dial position, and the driving means rotates the stepping motor according to the zero-start signal. Incidentally, the zero-start signal becomes a control signal to rotate the pointer from the present position by an angle of 270 degrees if the maximum swing angle of the pointer from the zero-dial position is 270 degrees and it is located at a position off by an angle of 10 degrees to the zero-dial position. Accordingly, in this case, the pointer receives a torque to further rotate by an angle of 10 degrees after it engages the maximum dial position stopper according to the zero-start signal and repeats to leave and engage the stopper as in the conventional case in which the pointer repeats to leave and engage the stopper. However, since the shift angle is so small that the repetition period of the pointer with regard to the stopper becomes small, the noise can be reduced without deteriorating the visibility.

After generation of the zero-start signal, the control signal generation means generates a zero-return signal to move the pointer from the maximum position to the zero position, and the driving means drives the stepping motor to rotate according to the zero-return signal. Accordingly, the pointer moves from the maximum position to the zero position. After the pointer returns to the zero position, the control signal generating means will not leave the zero-position since the control signal to move the pointer is not generated thereafter and the visibility is not deteriorated and noise is restrained.

Thus, according to the present invention, although the pointer may repeatedly leave and return to the maximum position due to the zero-start signal, such motion is so short that the visibility and noise as a whole while the pointer moves from the present position to the zero position is negligible and also such motion is not caused by the zero-return signal.

The control signal generating means generates the zero-start signal and the zero-return signal contiguously when the indicating instrument is powered.

The pointer is a self-illuminating pointer illuminating when it is powered and a smoke glass window is disposed in front of the pointer. The self-illuminating pointer is illuminated when powered and moves to the maximum-position and, thereafter, to the zero-position. Thus, a luxurious feeling can be provided.

BRIEF DESCRIPTION OF THE DRAWINGS

Other objects, features and characteristics of the present invention as well as the functions of related parts of the present invention will become clear from a study of the following detailed description, the appended claims and the drawings. In the drawings:

DETAILED DESCRIPTION OF THE PREFERRED EMBODIMENT

A preferred embodiment is described with reference to the appended drawings.

Figure 1:
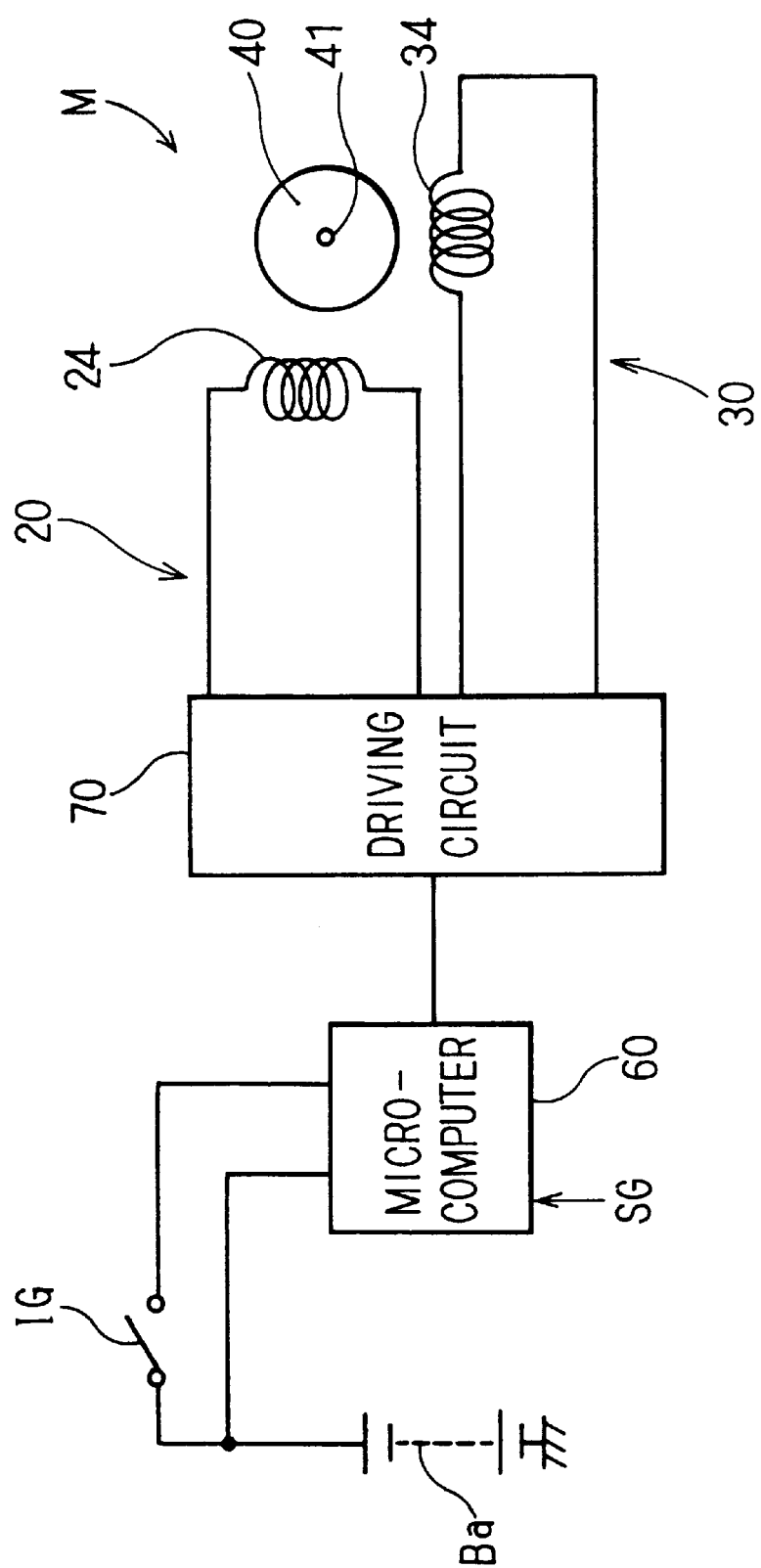
FIG. 1 is a block diagram of an indicating instrument having a stepping motor.

In FIG. 1, M is a two-phase PM-type stepping motor which has a magnet rotor 40, an output shaft 41 and stators 20 and 30 having an A-phase coil 24 and a B-phase coil 34 respectively. A battery Ba is connected through an ignition switch IG to a microcomputer 60. A driving circuit 70 is connected to the microcomputer 60 to supply the A-phase coil 24 with sine wave current and the B-phase coil 34 with cosine wave current according to signals of the microcomputer 60.

Figure 2:
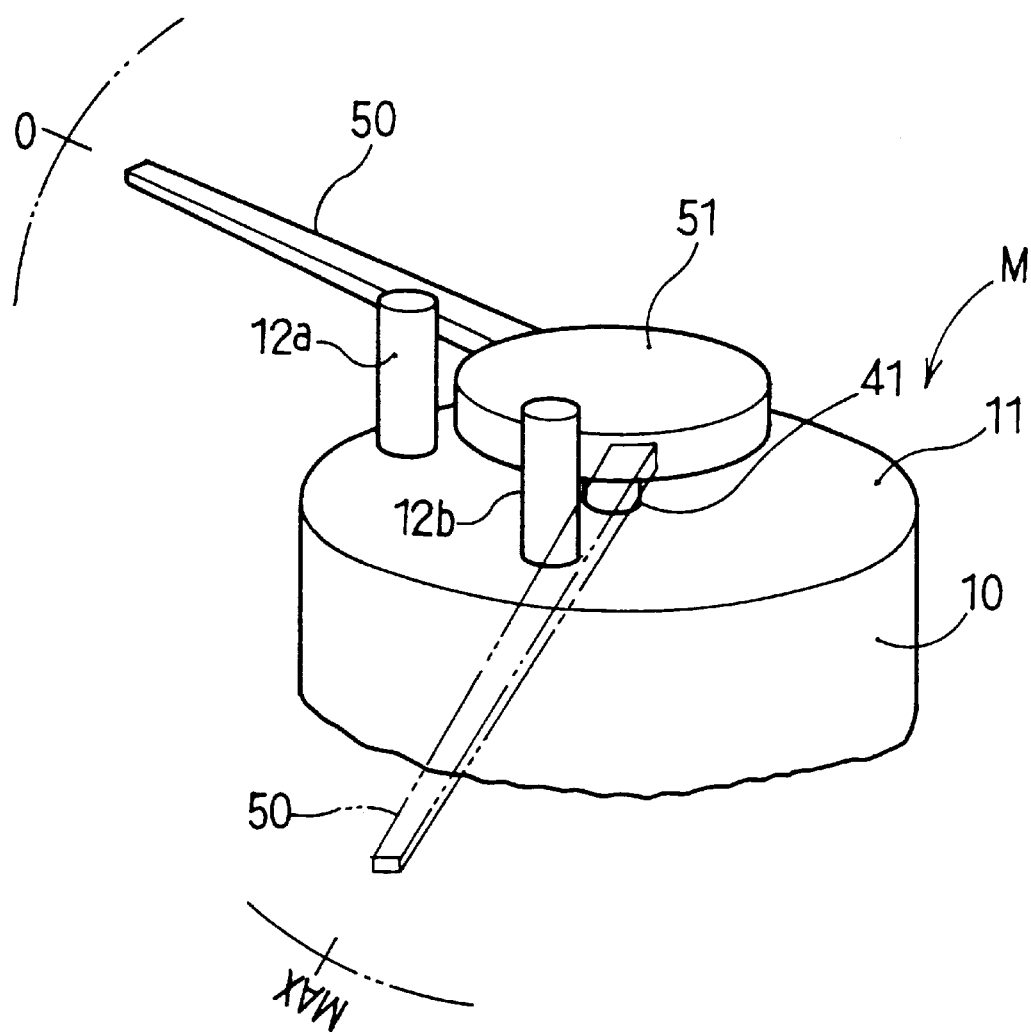
FIG. 2 is a perspective view illustrating a portion around the indicator of the instrument.
Figure 3:
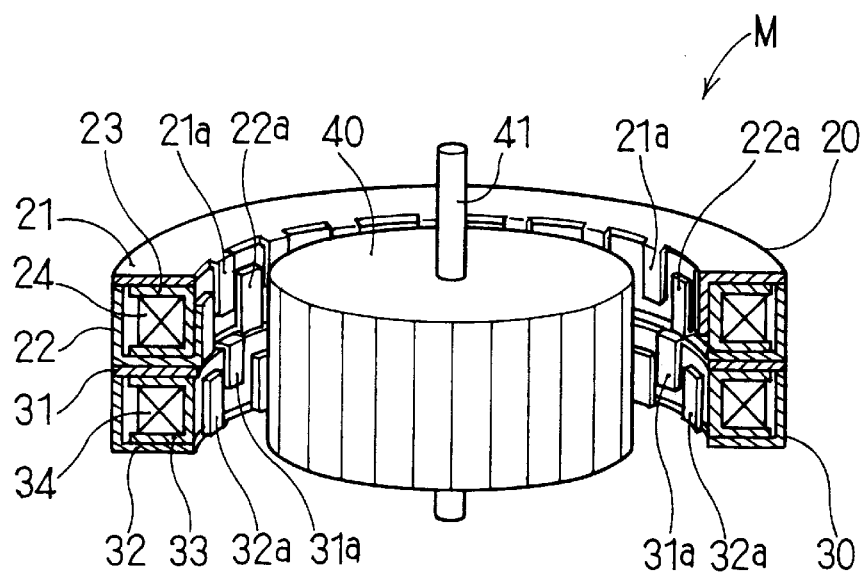
FIG. 3 is a partially sectional perspective view illustrating a stator and a rotor of the stepping motor.

The stepping motor M, as shown in FIG. 2, has a cylindrical casing 10, in which a pair of upper and lower stators 20 and 30 are coaxially installed as shown in FIG. 3.

The stator 20 is composed of a pair of annular yokes 21 and 22 disposed to form generally a U-shape in a cross-section and the A-phase coil (annular coil) wound around a bobbin 23 disposed between the yokes 21 and 22. Teeth 21a and 22a are alternately formed along the inner periphery of the yokes 21 and 22. In this embodiment, the number of the teeth 21a and 22a are 12 each. The teeth 21a and 22a are formed at an equal interval (at an angle of 15 degrees) in the circumferential direction.

On the other hand, the stator 30 is composed of a pair of annular yokes 31 and 32 disposed to form generally a U-shape in a cross-section and the B-phase coil (annular coil) wound around a bobbin 33 disposed between the yokes 31 and 32. Teeth 31a and 32a are alternately formed along the inner periphery of the yokes 31 and 32. In this embodiment, the number of the teeth 31a and 32a are 12 each. The teeth 31a and 32a are formed at an equal interval (at an angle of 15 degree) in the circumferential direction and spaced from the teeth 21a and 22a at a half (½) of the interval.

The magnet rotor 40 is disposed coaxially inside both stators 20 and 30. The output shaft 41 of the magnet rotor 40 is supported by center bearings (not shown) respectively fixed to an upper wall 11 of the casing 10 and to a bottom wall.

A plurality of magnetized permanent magnets are disposed around the magnet rotor 40 in the circumferential direction. In more detail, the same number (twelve) of the N-poled and S-poled portions of the magnet rotor 40 are alternately disposed in the circumferential direction at an equal interval (an angle of 15 degree).

Figure 4:
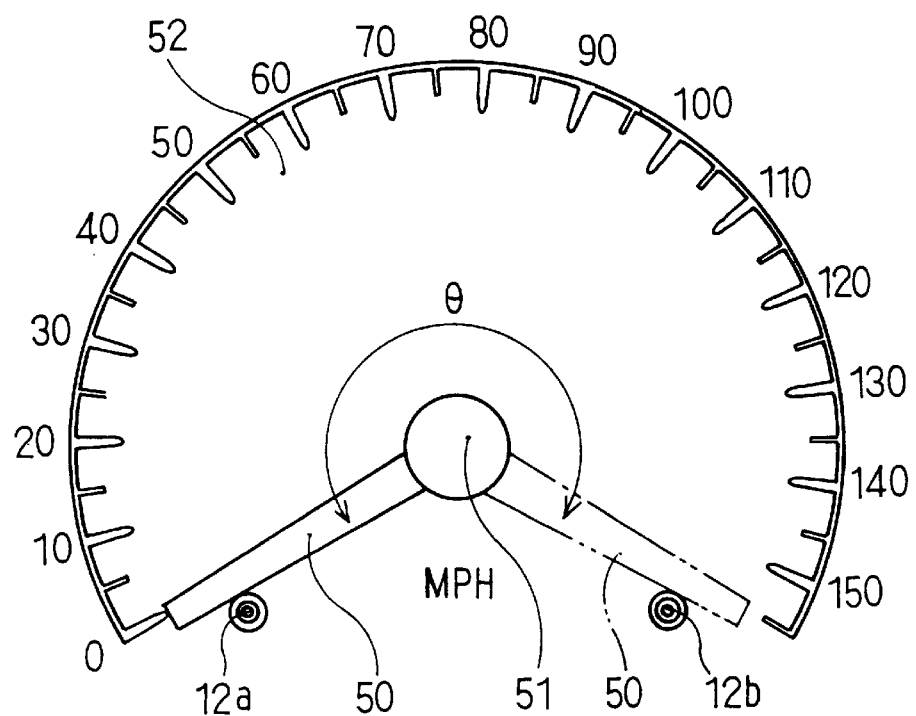
FIG. 4 is a plan view illustrating a dial plate.

A indicator boss member 51 is connected to the output shaft 41 of the magnet rotor 40 as shown in FIG. 2. A pointer 50 extends from the indicator boss member 51 as shown in FIG. 2 and FIG. 4 to move along the surface of a dial plate 52 (which is omitted in FIG. 2, see FIG. 4) when the magnet rotor rotates.

A zero-position rod stopper 12a and a maximum-position rod stopper 12b extend from the upper wall portion 11 to be located at the zero position and at the maximum position of the dial plate 52 respectively.

Figure 5:
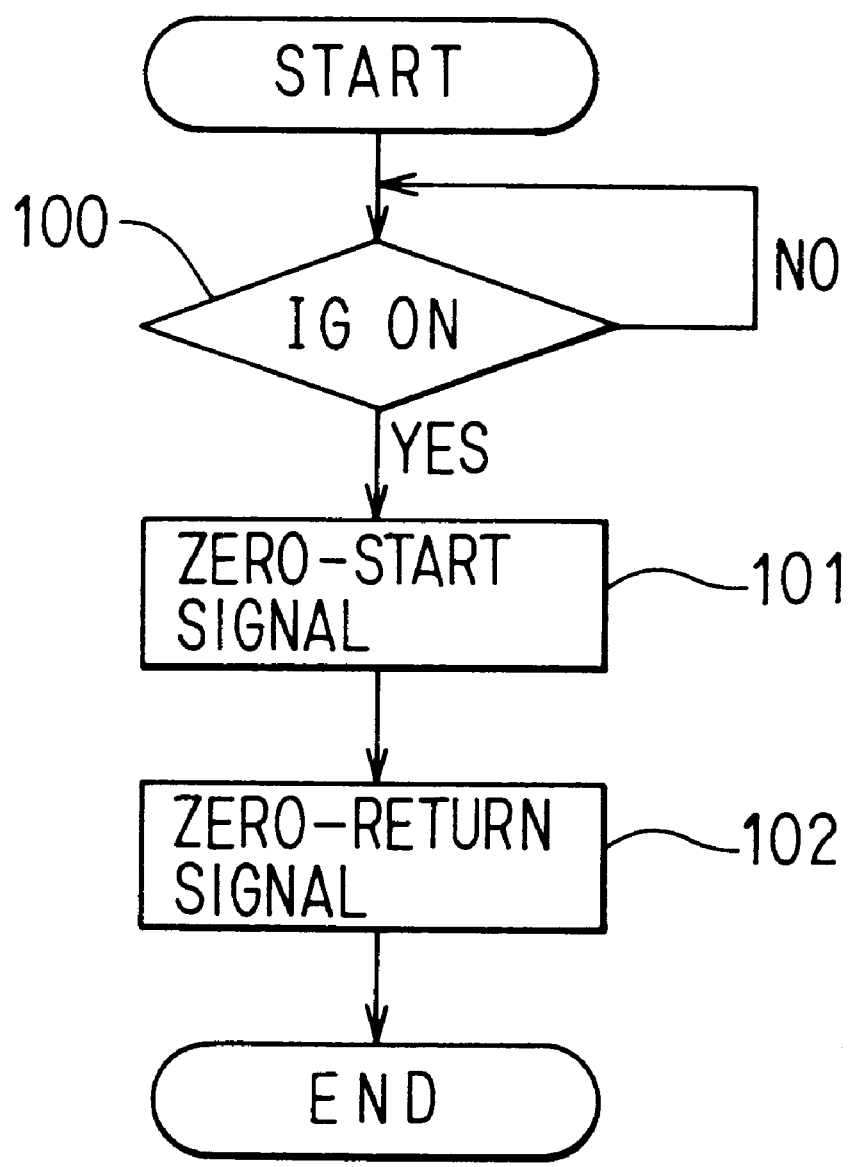
FIG. 5 is a flow chart of control steps (zero-return process) of a microcomputer according to the embodiment of the present invention.

The microcomputer 60 executes a zero-return process of the indicator as shown in FIG. 5.

That is, the microcomputer 60 examines repeatedly whether the ignition switch IG is turned on or not in step 100 when the battery Ba is connected.

When the ignition switch IG is turned on and so detected, a zero-start signal is supplied to the driving circuit 70 in step 101. The driving circuit 70 supplies the A-phase coil 24 and the B-phase coil 34 of the stepping motor M with the sine wave current and the cosine wave current respectively according to the zero-start signal, so that the magnet rotor 40 rotates and the pointer 50 moves from the present position toward the maximum position.

The zero-start signal is defined as a signal corresponding to a control signal to drive the pointer 50 from the zero-position of the dial plate 52 to the maximum position thereof. For example, if a maximum swing angle of the pointer 50 from the zero position to the maximum position θ shown in FIG. 4 is 270° and the position of the pointer 50 where the ignition switch IG is turned on is an angle 10° remote from the zero-position, the pointer swings by an angle range 260° from the original position until it engages the maximum-position stopper 12b. Thereafter, it is stopped by the stopper although it is going to move another angle of 10°. While the pointer 50 is in engagement with the maximum-position stopper 12b, the pointer 50 leaves and abuts the maximum-position stopper 12b frequently as in the conventional case. Because the deflection or divergence of the pointer from the zero position occurs generally close to the zero-position, the time period of the aforementioned movement is so short that better visibility and less noise than the conventional instrument can be ensured.

After supplying the zero-start signal, the microcomputer 60 generates the zero-return signal and send it to the driving circuit 70 (step 102). The driving circuit 70 supplies the A-phase coil 24 and the B-phase coil 34 with the sine wave current and the cosine wave current respectively so that the magnet rotor 40 rotates and the pointer 50 moves from the maximum position toward the zero position.

Incidentally, the zero-return signal is a signal to drive the pointer 50 from the maximum position to the zero position. Therefore, the pointer 50 located at the maximum position moves to the zero position. The microcomputer 60 terminates the zero-return process after it generates the zero-return signal. As a result, the pointer 50 does not leave and abuts the zero-position stopper 12a repeatedly thereafter, thereby preventing deterioration of the visibility and generation of noise.

Thus, although the pointer leaves and abuts the maximum-position stopper 12b caused by the zero-start signal, the time period thereof is so short and the pointer 50 does not leave and abuts the zero-position stopper by the zero-return signal so that the visibility and noise reduction in the returning course of the pointer 50 from the present position to the zero position is improved.

Figure 6:
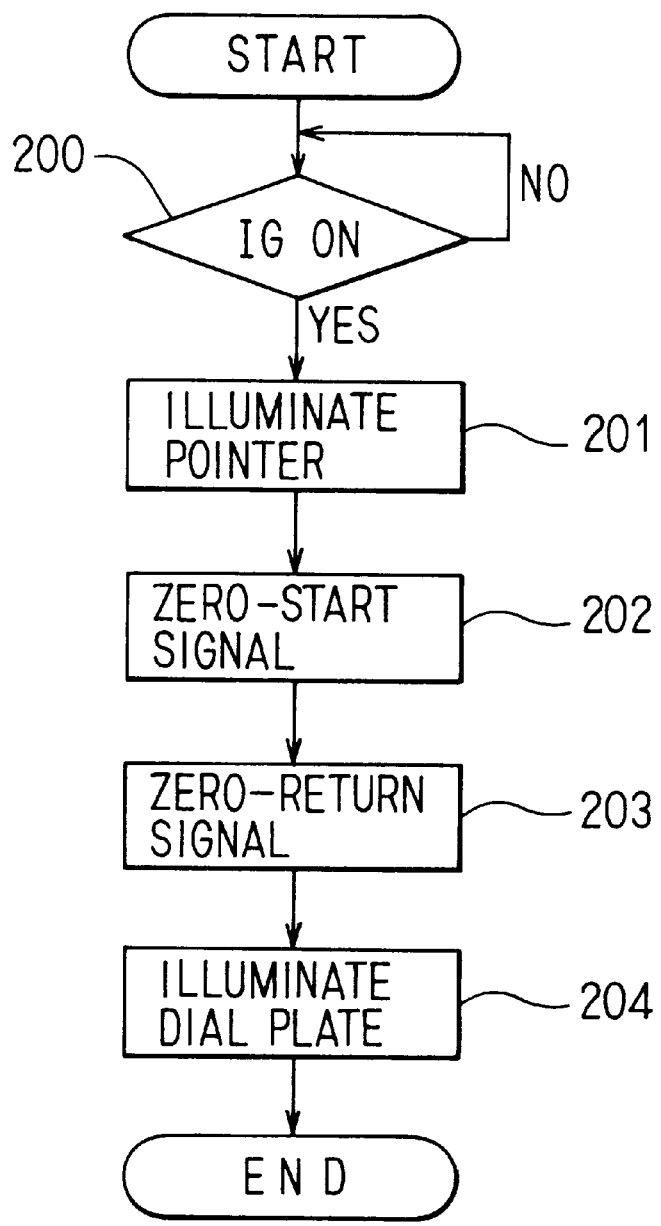
FIG. 6 is a flow chart of a zero-return process of the microcomputer of an indicating instrument with a stepping motor having a self-illuminating pointer and a smoke glass window in front thereof.

FIG. 6 shows a zero-return process of the microprocessor 60 of an indicator instrument with a stepping motor which has a self illuminating pointer powered by a power source and a smoke-glass in front of the pointer 50.

As shown in FIG. 6, the microcomputer 60 examines whether the ignition switch is turned on or not repeatedly in step 200 when the battery is connected.

The microcomputer 60 supplies a control signal to illuminate the pointer 50 using a lamp circuit (not shown) when the ignition switch IG is operated and so detected, so that the pointer 50 is lit in step 201.

Thereafter the microcomputer 60 generates the zero-start signal. The zero-start signal causes the illuminating pointer 50 to move from the present position toward the maximum position as in the case of the zero-start signal in step 101 shown in FIG. 5.

The microcomputer 60 generates the zero-return signal thereafter and sends it to the driving circuit 70 in step 203. The zero-return signal causes the illuminating pointer 50 to move from the maximum position toward the zero position as in the case of the zero-return signal in step 102 shown in FIG. 5.

As a variant, the microcomputer 60 may generate the zero-start signal when a vehicle door is opened after the ignition switch IG is operated. In this case, the adjusting operation may not be found by a driver.

Thereafter, the microcomputer 60 supplies the lamp circuit (not shown) with the control signal to illuminate the dial plate 52 in step 204.

Thus, in the indicating instrument with a stepping motor which has a self-illuminating pointer, the self-illuminating pointer 50 illuminates when it is powered and moves to the maximum position and to the zero position while illuminating. Therefore, an indicating instrument having a luxurious feeling can be provided.

In the foregoing description of the present invention, the invention has been disclosed with reference to specific embodiments thereof. It will, however, be evident that various modifications and changes may be made to the specific embodiments of the present invention without departing from the broader spirit and scope of the invention as set forth in the appended claims. Accordingly, the description of the present invention in this document is to be regarded in an illustrative, rather than restrictive, sense.

What is claimed is:

1. A stepping motor type indicating instrument comprising:

a stepping motor;

a pointer moving as said stepping motor rotates;

a zero-position stopper for stopping said pointer when said pointer reaches a zero dial position;

a maximum-position stopper for stopping said pointer when said pointer reaches a maximum-dial position;

control signal generating means for generating a zero-start signal to rotate said pointer from said zero-dial position to said maximum-dial position and for, thereafter, generating a zero-return signal to return said pointer from said maximum-dial position to said zero-dial position; and driving means for driving said stepping motor according to said zero-start signal and said zero-return signal.

2. A stepping motor type indicating instrument as claimed in claim 1, wherein said control signal generating means is for venerating said zero-start signal and said zero-return signal contiguously when said indicating instrument is powered.

3. A stepping motor type indicating instrument as claimed in claim 2, wherein said pointer is a self-illuminating pointer illuminating when it is powered and a smoke glass window is disposed in front of said pointer.

4. A stepping motor type indicating instrument as claimed in claim 1, wherein said control signal generating means is for generating said zero-return signal when said pointer engages said maximum position stopper.

5. A stepping motor type indicating instrument comprising:

a switch connected to a battery;

a stepping motor having a pointer which moves as said stepping motor rotates;

a zero-position stopper for stopping said pointer when said pointer reaches a zero dial position;

a maximum-position stopper for stopping said pointer when said pointer reaches a maximum-dial position;

control signal generating means for generating a first control signal for driving said stepping motor so that said pointer moves from said zero-dial position to said maximum dial position until said pointer engages said maximum-position stopper and for, thereafter, generating a second control signal for driving said stepping motor so that said pointer moves from said maximum-dial position to said zero-dial position until said pointer engages said zero-position stopper for a period after said switch is turned on; and driving means for driving said stepping motor according to said first and second control signals.

* * * * *